US 6,543,043 B1

(12) United States Patent
Wang et al.

(10) Patent No.: US 6,543,043 B1
(45) Date of Patent: Apr. 1, 2003

(54) INTER-REGION CONSTRAINT-BASED ROUTER FOR USE IN ELECTRONIC DESIGN AUTOMATION

(75) Inventors: Xiao-Dong Wang, San Jose, CA (US); David Chyan, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 73 days.

(21) Appl. No.: 09/586,669

(22) Filed: Jun. 1, 2000

(51) Int. Cl.⁷ .............................................. G06F 17/50
(52) U.S. Cl. .......................................... 716/14; 716/13
(58) Field of Search ............................... 716/12, 13, 14

(56) References Cited

U.S. PATENT DOCUMENTS 6,324,675 B1 * 11/2001 Dutta et al. .................... 716/13
6,327,697 B1 * 12/2001 Ghosh .......................... 716/12
6,349,403 B1 *  2/2002 Dutta et al. .................... 716/12

OTHER PUBLICATIONS

Cai, Yang, et al., "Optimal Channel Pin Assignment," IEEE Transactions on Computer–Aided Design, vol. 10, No. 11, Nov. 1991, pp. 1413–1424.
Groeneveld, Patrick, "Wire Ordering for Detailed Routing," IEEE Design & Test of Computers, Dec. 1989, pp. 6–17.
Dai, Wayne Wei–Ming, et al., "Rubber Band Routing and Dynamic Data Representation," 1990 IEEE International Conference on Computer–Aided Design, Nov. 11–15, 1990, pp. 52–55.
Reed, James, et al., "A New Symbolic Channel router: YACR2," IEEE Transactions on Computer–Aided Design, vol. CAD–4, No. 3, Jul. 1985, pp. 208–219.
Yoshimura, Takeshi, et al., "Efficient Algorithms for Channel Routing," IEEE Transactions on Computer–Aided Design of Integrated Circuits and Systems, vol. CAD–1, No. 1, Jan. 1982.
Rivest, Ronald L., et al., "A 'greedy' channel router," Computer–Aided Design, vol. 15, No. 3, May 1983, pp. 135–140.
Deutsch, David N., "A 'Dogleg' Channel Router," Proc. 13$^{th}$ Des. Aut. Conf. IEEE (1976), pp. 425–433.

* cited by examiner

Primary Examiner—John F. Niebling
Assistant Examiner—Stacy Whitmore
(74) Attorney, Agent, or Firm—Bingham McCutchen LLP

(57) ABSTRACT

A system and method for routing wires using an automated circuit design tool includes a process for order negotiation to adjust the ordering of wires back and forth between conduits by considering both inter-region and intra-region constraints on the layout of the wires. Order negotiation is preferably carried out by looking both forward and backward during the processing of channels, and by flexibly accounting for intra-region, crosstalk, and grouping constraints, as well as conduit exit constraints. Pairs of nets within a conduit are classified in different categories, including (1) having internal constraints, and (2) not having internal constraints. Nets having internal constraints are generally used in order negotiation for limited purposes (e.g., breaking a loop), whereas nets having no internal constraints are generally used in order negotiation for a variety of other purposes as well, including improving the layout of other conduits.

23 Claims, 8 Drawing Sheets

INTER-REGION CONSTRAINT-BASED ROUTER FOR USE IN ELECTRONIC DESIGN AUTOMATION

BACKGROUND OF THE INVENTION

1. Field of the Invention

The field of the present invention relates to electronic design automation and, more particularly, to methods and systems for routing wires in circuit designs created through an electronic design automation procedure.

2. Background

Chip designers often use electronic design automation (EDA) software tools to assist in the design process, and to allow simulation of a chip design prior to prototyping or production. Chip design using EDA software tools generally involves an iterative process whereby the chip design is gradually perfected. Typically, the chip designer builds up a circuit by inputting information at a computer workstation generally having high quality graphics capability so as to display portions of the circuit design as needed. A top-down design methodology is commonly employed using hardware description languages (HDLs), such as Verilog® or VHDL, for example, by which the designer creates an integrated circuit by hierarchically defining functional components of the circuit, and then decomposing each component into smaller and smaller components.

The various components of an integrated circuit are initially defined by their functional operations and relevant inputs and outputs. From the HDL or other high level description, the actual logic cell implementation is typically determined by logic synthesis, which converts the functional description of the circuit into a specific circuit implementation. The logic cells are then "placed" (i.e., given specific coordinate locations in the circuit layout) and "routed" (i.e., wired or connected together according to the designer's circuit definitions). The placement and routing software routines generally accept as their input a flattened netlist that has been generated by the logic synthesis process. This flattened netlist identifies the specific logic cell instances from a target standard cell library, and describes the specific cell-to-cell connectivity.

Presently, there are two common types of low-level routing tools, also known as detail routers. The first type, known as "channel routers," divide a chip design into channels and place junction pins (i.e., channel wire exits) between the channels. A disadvantage of channel routers is the requirement in advance of good channel ordering—i.e., a defined order of processing channels such that the final physical layout does not contain an over-abundance of cross-overs or too many unnecessarily lengthy wires. Another disadvantage of channel routers is that mis-matches of junction wire ordering often occur, leading to twisted wires and wasted space. These disadvantages can lead to a larger chip size than might otherwise be required.

The second type of detail router are known as "maze routers." Maze routers tend to route wires individually, with only an initial ordering of all wires, and thus ordering the junction wires arbitrarily. Hence, they suffer from the same problem of mis-matching of junction wire ordering, and can also lead to an unnecessarily large chip size.

To address the problems associated with channel ordering in conventional detail routers, some methods have been developed which use a rough one-pass ordering to arrive at an initial channel ordering. Examples of these methods are described in, for example, D. F. Wong and M. Guruswamy, "Channel Ordering for VLSI Layout with Rectilinear Modules," *IEEE Transaction of Computer-Aided Design*, Vol. 10, No. 11 (Nov. 1991), pp. 1425–1431, and W. M. Dai et al, "Routing Region Definition and Ordering Scheme for Building-Block Layout," *IEEE Trans. Computer-Aided Design*, Vol. CAD-4 (July 1985), pp. 189–197. According to these techniques, based on the resulting channel order from the rough one-pass ordering, the channels routed first decide the junction wire orders/positions for channels routed later, in essentially a unidirectional manner. However, since these unidirectional methods do not consider the effects of later channels on the previous channels, the resulting channel ordering can often be poor at the junctions. Furthermore, most attention by designers and researchers has focused primarily on optimizing the metrics internal to the channels, but have failed to sufficiently address inter-region constraints on channel ordering.

A subsidiary problem during the routing process is known as the track ordering problem, which involves associating wires in the same channel with specific tracks in the channel. The simplest approach arbitrarily assigns wires to tracks within a single channel. However, such as arbitrary assignment will generally fail to arrive at an optimal physical layout, and may, for example, lead to numerous wire cross-overs. Another approach is to address track ordering through the defined channel ordering; that is, to assign tracks based upon the optimal wire layout from channel to channel following the same order as the channel layout. This approach also will generally fail to arrive at an optimal physical layout, because the amount of information that is utilized in ordering the tracks is generally limited due to the dependence of the technique on the sequence of channels handled in channel ordering.

One approach to the track ordering problem involves topological (i.e., planar) ordering, and is generally described in P. Groeneveld, "Wire Ordering for Detailed Routing," *IEEE Design & Test of Computers* (1989), pp. 6–17. Topological ordering techniques generally attempt to minimize the crossings between nets and to maintain as much planarity as possible at each junction based on the topology derived from the placement graph. It can be successfully applied to remove wire twisting at junctions. However, topological ordering techniques typically do not address the sequence of junctions to be operated on, nor the potential interaction between junctions and channels.

A potential problem in all circuit design layouts is crosstalk, which, from a general standpoint, is signal interference that can occur between adjacent or closely spaced wires. Crosstalk can lead to increased noise in signals carried across the affected wires, which in turn can lead to deteriorated noise margins and, possibly, to errors in signal propagation. A variety of techniques have been developed to estimate and/or reduce the potential for crosstalk in electrical circuits. For example, certain crosstalk techniques are described in T. Xue, et al., "Post Global Routing Crosstalk Risk Estimation and Reduction," DAC Proceedings (1996), pp. 302–309. However, the ability of such conventional techniques to reduce crosstalk is limited because conventional global routers are typically unable to provide the type of detailed track location information needed to calculate the exact noise levels.

There is a need for a technique for automated circuit design tools which permit more efficient routing of wires and, particularly, for reducing twisted wires and minimizing wire lengths. There is further a need for an automated design tool useful for routing wires and also useful for reducing the potential for crosstalk between near or adjacent wires.

SUMMARY OF THE INVENTION

The invention provides in one aspect systems and methods for routing wires using an automated circuit design tool.

In one embodiment as disclosed herein, order negotiation is used to adjust the ordering of wires back and forth between conduits (i.e., routing regions, as further explained herein) by considering both inter-region and intra-region constraints on the layout of the wires. In a preferred embodiment, order negotiation is carried out by looking both forward and backward during the processing of channels, and switching back and forth between conduits in adjusting the wire orders for each net. The order negotiation process may flexibly account for intra-region, crosstalk, and grouping constraints, as well as conduit exit constraints. Further, the order negotiation process may be capable of working with loosely defined conduits and imperfect conduit ordering, and does not necessarily require well-defined channels and channel ordering.

In another embodiment as disclosed herein, pairs of nets within a conduit are classified in different categories, including (1) having internal constraints, and (2) not having internal constraints. Pairs (or other multiples) of nets in the first category (i.e., having internal constraints) are generally used in order negotiation for limited purposes (e.g., breaking a loop), whereas pairs (or other multiples) of nets in the second category (i.e., having no internal constraints) are used in order negotiation for a variety of other purposes as well, including improving the layout of other conduits.

Further embodiments, modifications, variations and enhancements are also described herein.

DETAILED DESCRIPTION OF PREFERRED EMBODIMENTS

Preferred embodiments will now be described, with reference as necessary to the accompanying drawings. First, however, additional general background information is provided concerning electronic design automation (EDA) software tools.

As explained earlier herein, chip designers generally use a top-down design methodology, starting with hardware description languages (HDLs), such as Verilog® or VHDL, for example, to create an integrated circuit by hierarchically defining functional components of the circuit, and then decomposing each component into smaller and smaller components. Two of the primary types of components used in integrated circuits are datapaths and control logic. Control logic, typically random logic, is used to control the operations of datapaths. Datapath areas of the circuit perform functional operations, such as mathematical or other operations.

The various components of an integrated circuit are initially defined by their functional operations and relevant inputs and outputs. The designer may also provide basic organizational information about the placement of components in the circuit using floorplanning tools. During these design states, the designer generally structures the circuit using considerable hierarchical information, and has typically provided substantial regularity in the design.

From the HDL or other high level description, as previously mentioned in the Background section hereof, the actual logic cell implementation is typically determined by logic synthesis, which converts the functional description of the circuit into a specific circuit implementation. The logic cells are then placed and routed. The placement and routing software routines generally accept as their input a flattened netlist that has been generated by the logic synthesis process. This flattened netlist, as previously indicated, identifies the specific logic cell instances from a target standard cell library, and describes the specific cell-to-cell connectivity.

Further explanation of a particular chip design process, with emphasis on placement and routing of datapaths, is set forth, for example, in U.S. Pat. No. 5,838,583, hereby incorporated by reference as if set forth fully herein.

Figure 1:
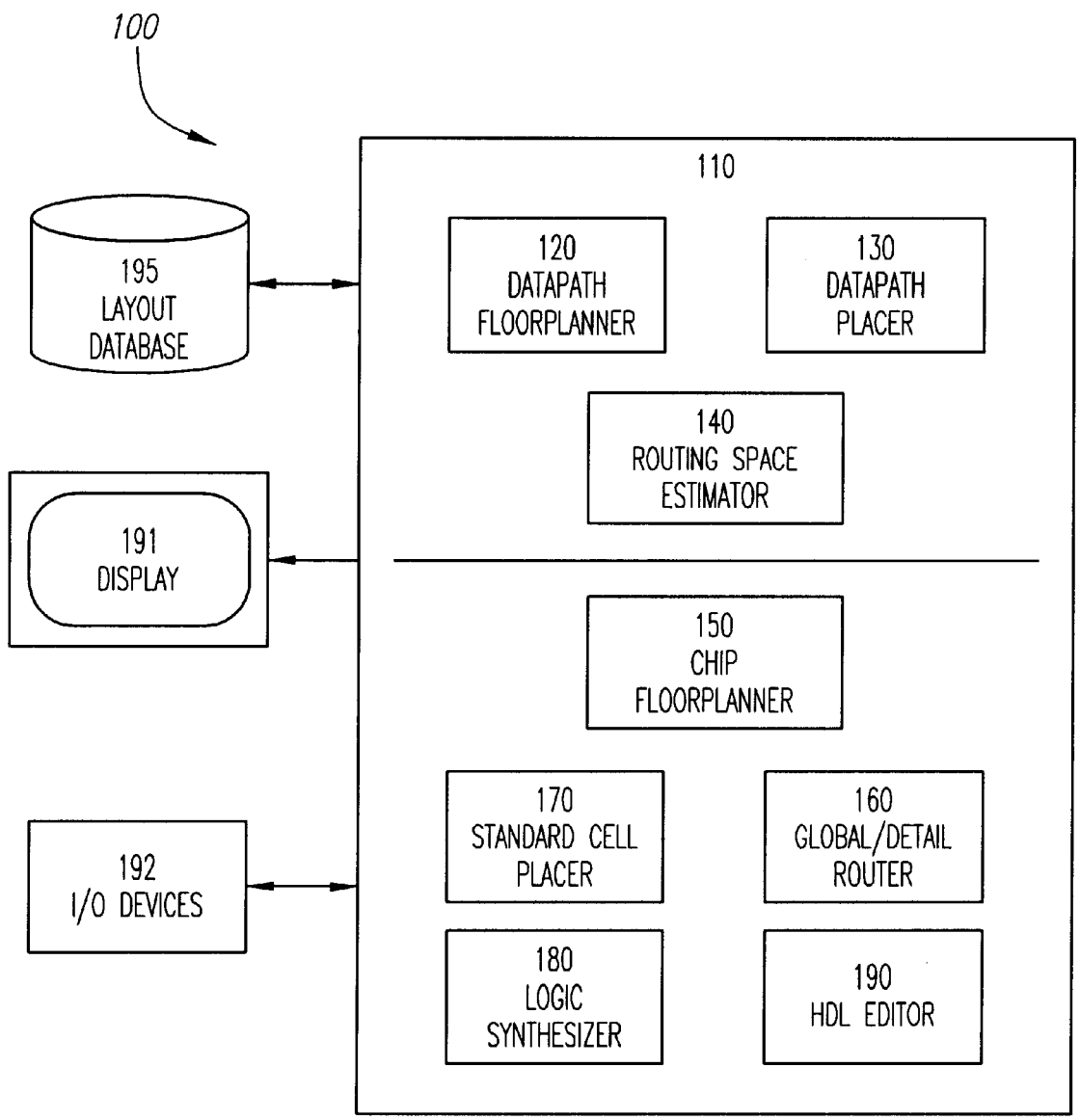
FIG. 1 is a diagram of a computer system that may be used in connection with various embodiments of the invention as described herein.

FIG. 1 is a diagram of a computer system that may be used in connection with various embodiments of the invention as described herein. As shown in FIG. 1, a computer system 100 includes a computer 110 connected to a display 191 and various input-output devices 192. The computer 110 may comprise one or more processors (not shown), as well as working memory (e.g., RAM) in an amount sufficient to satisfy the speed and processing requirements of the system. The computer 110 may comprise, for example, a SPARC™ workstation commercially available from Sun Computers, Inc. of Santa Clara, Calif., or any other suitable computer.

The computer 110 contains stored program code including, in one embodiment, a datapath floorplanner 120, a datapath placer 130 and a routing space estimator 140. The datapath flooplanner 120 provides for the definition of datapath functions, datapath regions, and constraints on these for the purpose of interactive floorplanning operations by the circuit designer, and the control of placement operations of the datapath placer 130. The datapath placer 130 determines the placement of datapath functions within datapath regions, and the placement of logic cell instances within each datapath function, according to the constraints defined by the circuit designer. The routing space estimator 140 estimates routing space required for routing the datapath functions, given the placement of such functions by the datapath placer 130.

In support of the above-mentioned system components, a chip floorplanner 150, global/detail router 160, standard cell placer 170, logic synthesizer 180, and HDL editor 190 may be usefully employed. Operation of the chip floorplanner 150, global/detail router 160, standard cell placer 170, logic synthesizer 180, and HDL editor 190 is conventional, as the design of these components is well known in the art of electronic design automation. Commercially available examples of these system components are Preview™, Cell3™, QPlace™, Synergy™, and Verilog®, respectively.

The computer 110 is preferably coupled to a mass storage device (e.g., magnetic disk or cartridge storage) providing a layout database 195 with which the foregoing system components interface. The layout database 195 may be implemented using the EDIF database standard. The computer 110 may also comprise or be connected to mass storage containing one or more component libraries (not shown) specifying features of electrical components available for use in circuit designs.

Figure 2:
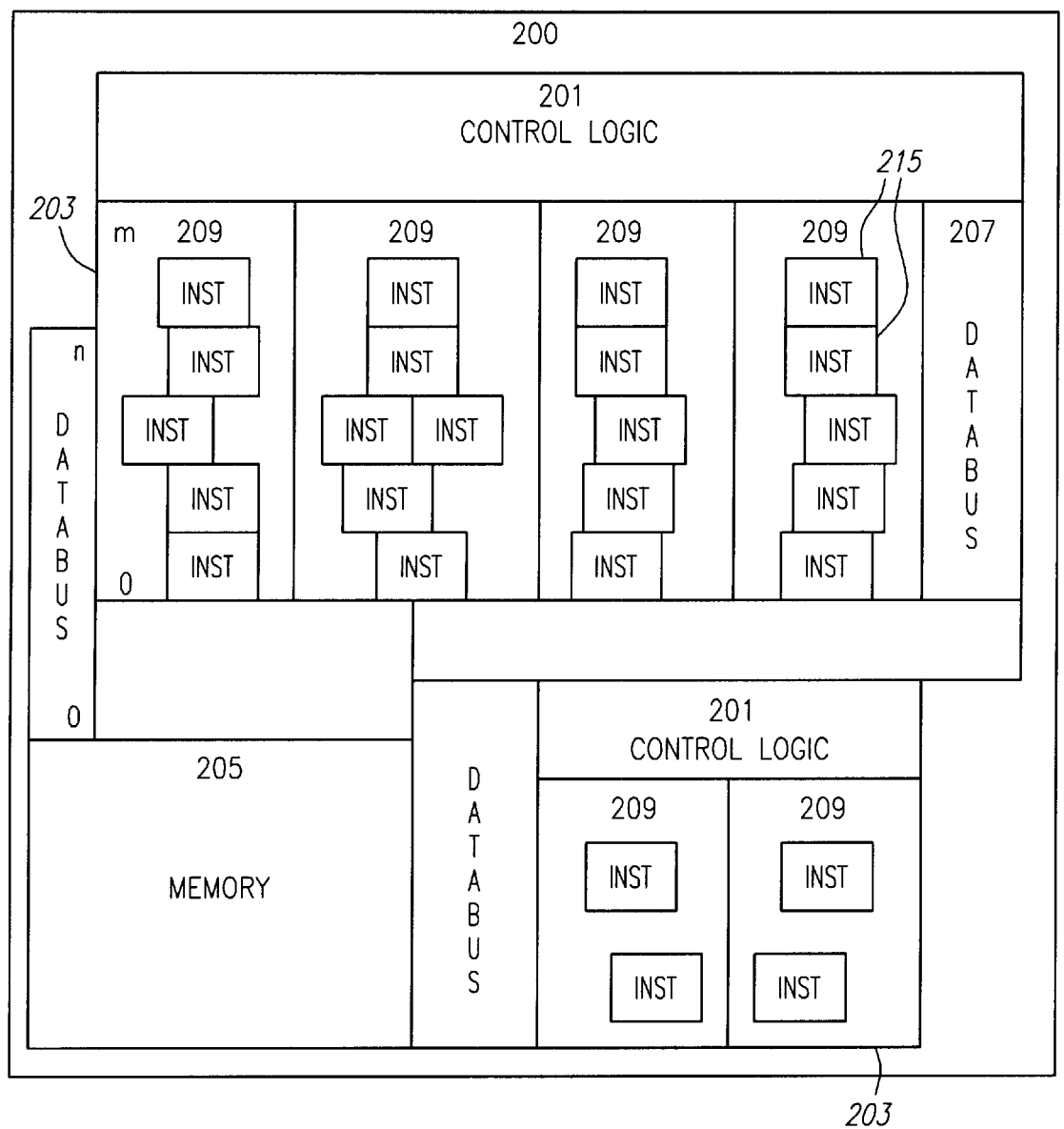
FIG. 2 is a diagram of a simplified integrated circuit as may be generated using a computer system such as shown in FIG. 1.

Referring now to FIG. 2, there is shown a schematic illustration of a simplified integrated circuit 200 that may be represented by circuit design data stored in the layout database 195. In actual, more realistic integrated circuit designs, the integrated circuit 200 would be far more complicated. However, FIG. 2 is useful for purposes of illustration. As shown therein, the integrated circuit 200 comprises of a plurality of control regions 201, datapath regions 203, and memory 205. The various control regions 201, datapath regions 203 and memory 205 are interconnected with databuses 207 generally spanning multiple bits. Each datapath region 203 may comprise a plurality of datapath functions 209. A datapath function 209 may utilize some or all of the bits available from the databus 207. A datapath function 209 may comprise a plurality of cell instances 215 which enable some form of signal or logic transformation of the data passed by the databus 207. The cell instance 215 within a datapath function 209 generally operates on the data carried on the datapath function 209.

As represented in the schema of the layout database 195, the integrated circuit 200 is comprised of a plurality of instances and a plurality of nets. A net interconnects a number of instances, by associating pins on each of the instances or, more generally, by associating the inputs and outputs of a number of instances.

Figure 3:
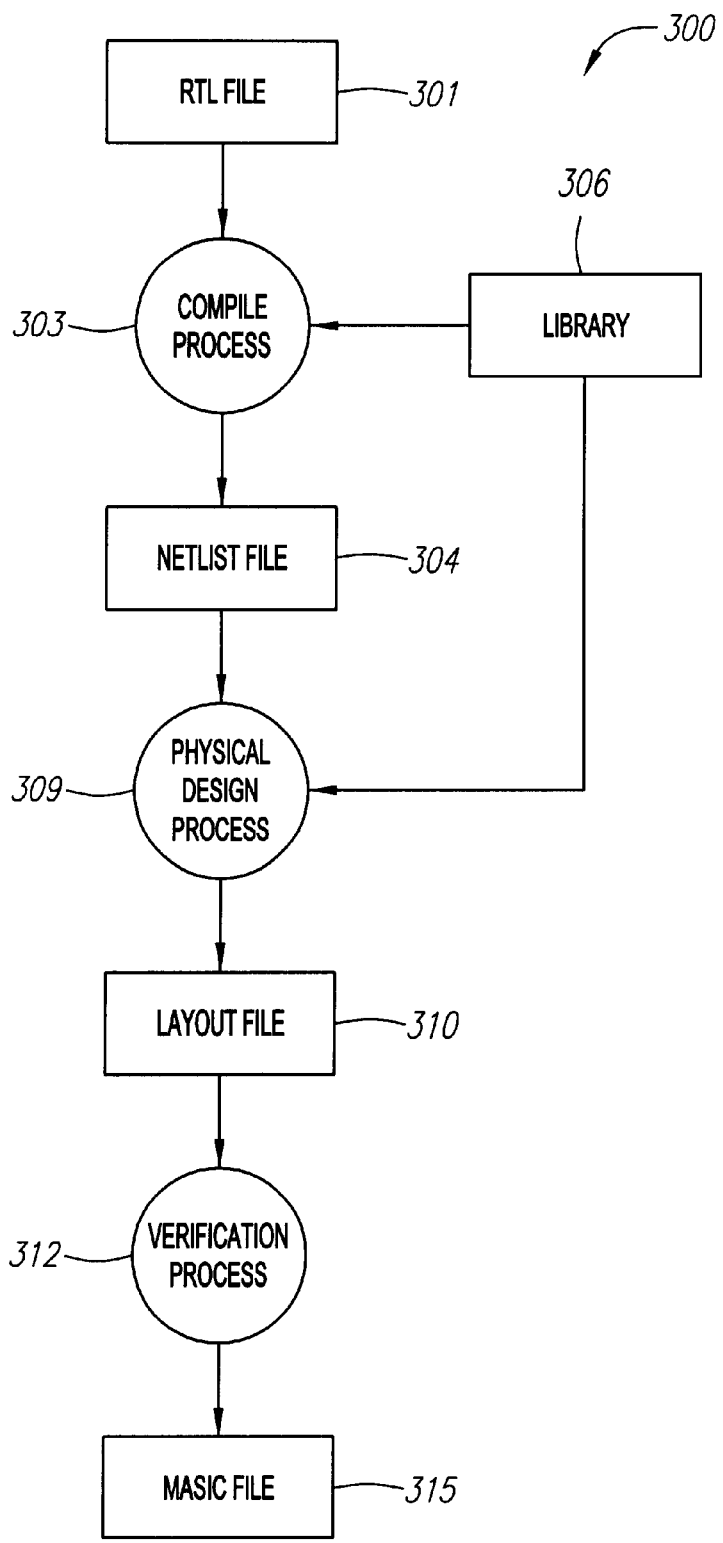
FIG. 3 is a diagram of a general process flow for a circuit design, illustrating various levels of circuit abstraction.

FIG. 3 is a diagram of a general process flow for a circuit design, illustrating some of the various levels of circuit abstraction as described above. As illustrated in FIG. 3, a register transfer logic (RTL) file 301 in the form of an HDL file or other high level functional description undergoes a compile process 303, which typically includes some form of logic synthesis, and converts the functional description of the circuit into a specific circuit implementation which may be stored in the form of a netlist file 304. As part of the compile process 303, a component library 306 is generally referenced, which stores information concerning what types of design components are available, and the characteristics of those design components which are needed in order to determine their functional connectivity. At this process stage, some attempt may be made at circuit optimization in order to minimize the number of components used in the circuit design. The netlist file 304, as previously noted, generally identifies the specific logic cell instances from a target standard cell library, and describes the specific cell-to-cell connectivity.

By application of a physical design process 309 shown in FIG. 3, the logic cells of the netlist file 304 are then placed and routed, resulting in a layout file 310. The component library 306 is utilized in this process stage in order to obtain information concerning the sizes of gates and other components that may be present in the netlist file 304.

From the layout file 310, a verification process 312 may be run, as further illustrated in FIG. 3, resulting in a mask file 315 in, for example, a GDSII or CIF format. The mask file 315 may be provided to a foundry, and contains enough information to allow the foundry to manufacture an actual integrated circuit therefrom.

According to one or more embodiments as described herein, the physical design process 309 shown in FIG. 3 includes a procedure for routing wires using an order negotiation process to adjust the ordering of wires back and forth between areas which will be generally referred to as conduits. In this context, the term conduit is broader than channel, as used in connection with traditional channel routers, and may include such things as routing regions (typically rectilinear in nature) as well as an "over-the-cell" region. Preferably, as described in more detail below, the order negotiation process takes into account both inter-region and intra-region constraints on the layout of the wires. Order negotiation is also preferably carried out by looking both forward and backward during the processing of channels, and switching back and forth between conduits in adjusting the wire orders for each net. The order negotiation process may flexibly account for intra region, crosstalk, and grouping constraints, as well as conduit exit constraints. Further, the order negotiation process may be capable of working with loosely defined conduits and imperfect conduit ordering, and does not necessarily require well-defined channels and channel ordering.

Figure 4:
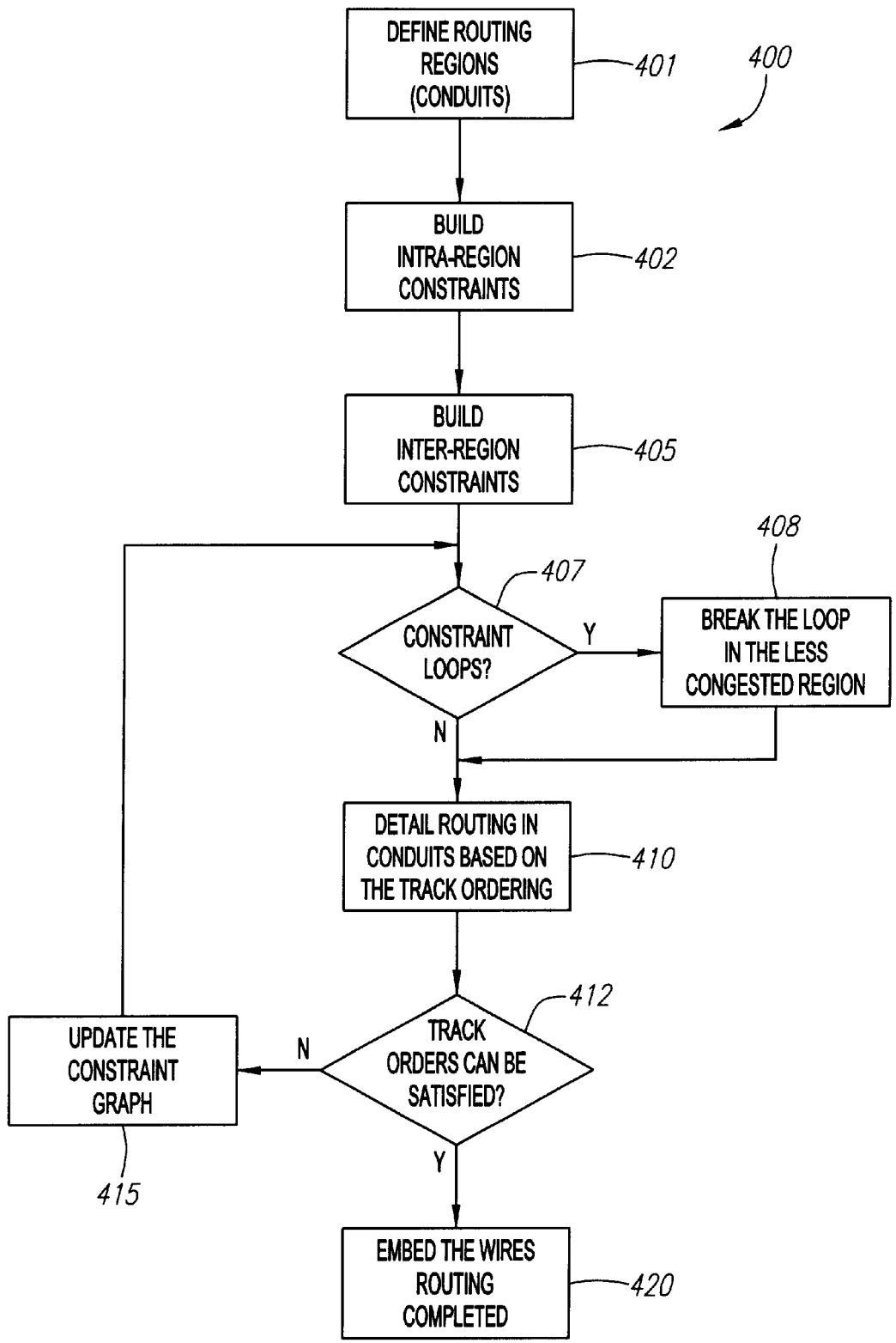
FIG. 4 is a process flow diagram in accordance with a preferred routing process as disclosed herein.

FIG. 4 is a process flow diagram in accordance with a preferred routing process 400 as disclosed herein. In the process 400 illustrated in FIG. 4, as explained in more detail hereinafter, pairs of nets within a conduit are preferably classified in different categories, including (1) having internal constraints, and (2) not having internal constraints. Pairs of nets in the first category (i.e., having internal constraints) are generally used in order negotiation for limited purposes (e.g., breaking a loop), wherein pairs of nets in the second category (i.e., having no internal constraints) are used in order negotiation for a variety of other purposes as well, including improving the layout of other conduits. By utilizing the order negotiation process 400 shown in FIG. 4, efficient track ordering, and thus wire placement, can be achieved, reducing the overall chip size requirements and leading to other potential benefits (e.g., reduced crosstalk) as well.

Figure 5:
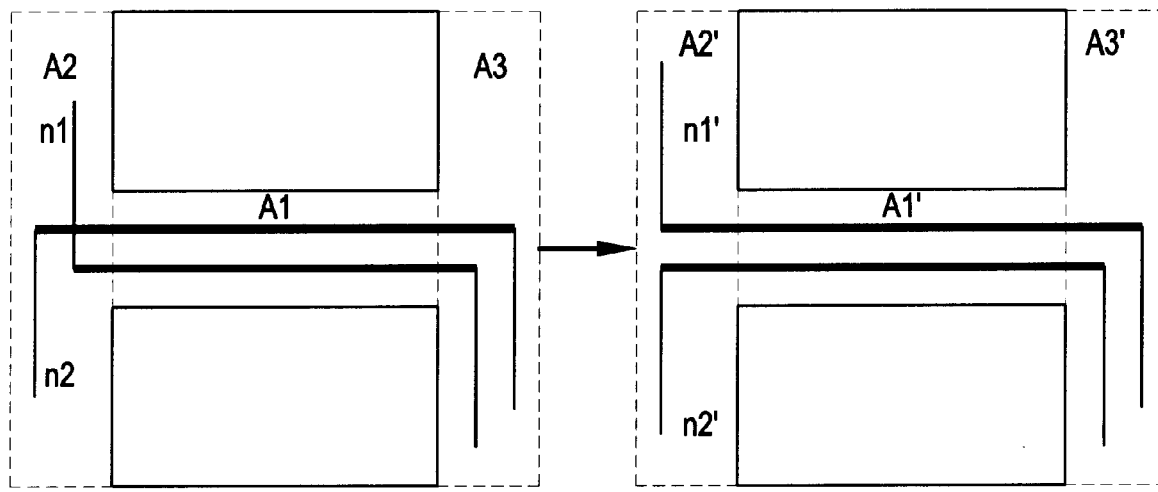
FIG. 5 is a diagram illustrating a track ordering problem.

FIG. 5 is a diagram illustrating a track ordering problem. In FIG. 5, examples of three routing areas (or conduits) A1, A2 and A3 are shown. For purposes of illustration, it may be assumed that the order of processing the conduits is sequential in that same order, i.e., A1, then A2, then A3. With conventional detail routers, the track ordering in conduit A1 is determined by itself, and the information in conduits A2 and A3 would not come into play at the time that the tracks in conduit A1 are determined. Thus, the order of nets n1 and n2 would be made arbitrarily in conduit A1. However, the order of nets n1 and n2 are not optimal for conduit A2. Consequently, when track ordering in conduit A2 is determined, nets n1 and n2 are required to cross, resulting in two tracks being needed instead of one. If nets n1 and n2 were swapped, however, only a single track would be needed instead of two.

The process 400 shown. in FIG. 4 takes account of the fact that in some channels (or conduits) there will be nets which have no constraints, and which thus can have arbitrary track ordering. During channel (or conduit) processing, the nets which have no constraints can be re-adjusted to save tracks in channels (or conduits) routed later, in a procedure generally referred to herein as global wire order negotiation. Again returning to the example depicted in FIG. 5, when conduit A2 is processed, a determination is made as to whether the pair of nets n1, n2 in conduit A1 is of the type having no internal constraints, or having internal constraints. In one implementation, for example, conduit A2 feeds back its desired order of nets n1, n2 to conduit A1. Since the pair of nets n1, n2 in conduit A1 is of the type having no internal constraints, nets n1, n2 are swapped in conduit A1, and an "order negotiation" between conduits A1 and A2 is accomplished. Whether or not nets n1, n2 are swapped in conduit A1, the order of nets n1, n2 remains the same in conduit A3. The result after the order negotiation is shown in FIG. 5, as modified nets n1' and n2' in conduits A1', A2' and A3'.

The same principle described above may be extrapolated where more than two nets are involved. Thus, more than two nets in single conduit may be "swapped" or otherwise re-routed according to an order negotiation process as described above.

Returning to FIG. 4, in a first step 401, routing regions (or conduits) are defined for the circuit design. The routing regions (or conduits) are preferably, but need not be, rectilinear in shape. While step 401 is similar to processes carried out in connection with conventional detail routers, step 401 is in fact broader, since more types of circuit features may be processed using the process 400 of FIG. 4 than with conventional detail routers.

In subsequent steps 402 and 403, respectively, a set of intra-region constraints and inter-region constraints are built for each of the routing regions (or conduits). To facilitate the processes in steps 402 and 403, various types of constraints are preferably defined. In a preferred embodiment, intra-region constraints which are handled include one or more or vertical constraints, horizontal constraints, crosstalk constraints and grouping constraints. In a preferred embodiment, inter-region constraints which are handled include one or more of junction wire planar ordering and inter-region vertical constraints. Other constraints may also be considered during the routing process 400, including constraints which are not either intra-region or inter-region constraints. For example, various net-based constraints may be considered, such as accumulated crosstalk noise.

In step 402, intra-region (i.e., internal) constraints are built for the various routing regions, while satisfying as many constraints as possible. Techniques for building vertical constraints and horizontal constraints are known in the art, and may be utilized in step 402. The result of step 402 is an intra-region constraint graph, as is known in the art. In step 403, inter-region constraints are built for the various routing regions, as described in more detail below. Such inter-region constraints include Conduit Exit Vertical Constraints (as defined below), Inter-region Vertical Constraints (as defined below), junction pin planarity constraints, and crosstalk constraints. The result of step 403 is an inter-region constraint graph.

Figure 6:
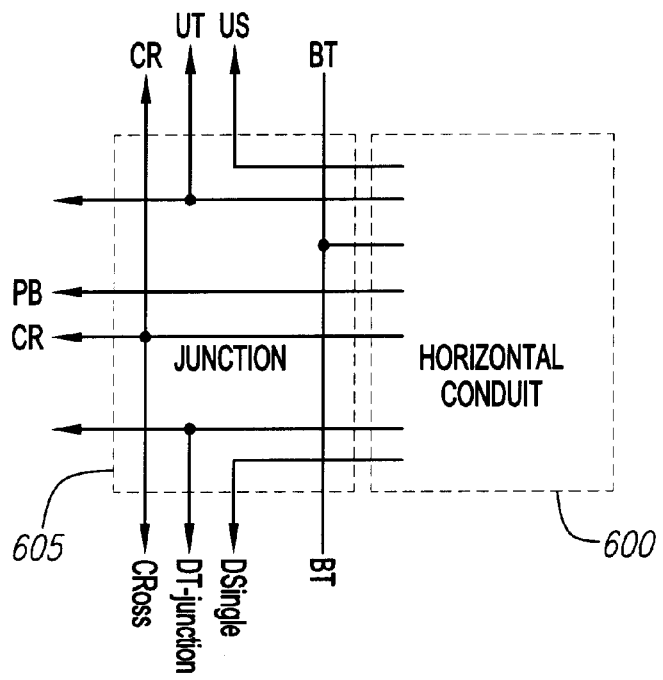
FIG. 6 is a diagram illustrating a classification of wire types as may occur at a junction between conduits.

In order to describe the routing process 400 in more detail, it is convenient to define a classification of wire types as may occur at a junction. FIG. 6 is a diagram illustrating a horizontal conduit 600 adjacent to a junction 605, along with various types of wires defined according to their physical features. The wire types exiting the horizontal conduit 600 may be classified in the following types: Pass-By (PB), Up Single (US), Down Single (DS), Up T-junction (UT), Down T-junction (DT), Cross (CR), and Balanced T-junction (BT). The wire types may also include matched Up Single and Down Single, and matched Up T-junction and Down T-junction. A Pass-By (PB) wire simply exits the junction 605 in the same direction as it entered from the conduit 600. An Up Single (US) wire only exits the junction 605 towards the top. A Down Single (DS) wire only exits the junction 605 towards the bottom. An Up T-junction (UT) wire exits the junction 605 straight through (as a Pass-By wire) and also towards the top (as an Up Single wire), thereby forming an upside down "T" intersection. A Down T-junction (DT) wire exits the junction 605 straight through (as a Pass-By wire) and also towards the bottom (as a Down Single wire), thereby forming a "T" intersection. A Cross (CR) wire exits the junction 605 towards the top, straight through, and also towards the bottom, as illustrated in FIG. 6. A Balanced T-junction (BT) wire exits the junction 605 towards both the top and the bottom, but does not head straight through the junction 605. A matched Up Single and Down Single wire is a pair of wires, one being an Up Single (US) wire and the other being a Down Single (DS) wire. A matched Up T-junction and Down T-junction wire is a pair of wires, one being an Up T-junction (UT) wire and the other being a Down T-junction (DT) wire.

A preferred ordering of exit wires from the left side of the horizontal conduit 600 from top to bottom may be denoted by the relationship:

$$(US, UT) \to (BT, CR, PB) \to (DS, DT) \qquad (\text{eq. 4.1})$$

where the notation "(c1, c2)", e.g., (US, UT), denotes that no preferred ordering exists between c1 and c2. Thus, for example, according to the above relationship, no preferred ordering exists between Up Single (US) and Up T-junction (UT) wires. The notation "c1→c2" denotes that c1 is preferably to the top of c2 in the horizontal conduit 600. Thus, for example, according to the above relationship, both the Up Single (US) and Up T-junction (UT) wires are preferably to the top of the Balanced T-junction (BT), Cross (CR) and Pass-By (PB) wires, but no preferred ordering exists among the Balanced T-junction (BT), Cross (CR) and Pass-By (PB) wires. The ordering preferences listed above in equation 4.1 are preferably defined as Conduit Exit Vertical Constraints for the purpose of global wire order negotiation according to one or more embodiments disclosed herein.

Figure 7:
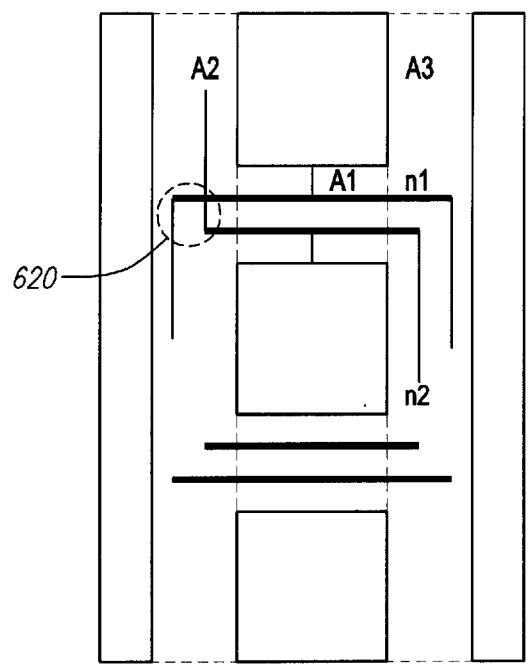
FIGS. 7, 8A and 8B are diagrams of routing paths illustrating different types of inter-region constraints.

It is further convenient to classify inter-region constraints in two categories, which are referred to herein as Conduit Exit Vertical Constraints (CEVCs) and Inter-Region Vertical Constraints (IEVCs). The nature of a Conduit Exit Vertical Constraint can be described according to the following relationship:

$$HC \to X \to HC \qquad (\text{eq. 4.2})$$

wherein "HC" denotes a horizontal constraint; "X" stands for "don't care" (i.e., any constraint, including the lack of a constraint), the notation "A→B" means that a constraint "A" in a conduit can potentially "propagate" to an adjacent conduit which has a constraint "B" (as explained in more detail herein); and the notation "A→B→C" has a similar meaning, but also implies that A and C are parallel conduits and that B is adjacent to both A and C. Therefore, the relationship "HC→X→HC" denotes a type of inter-regional constraint wherein two parallel conduits have horizontal constraints, and a third conduit having any type of constraint (or no constraint) is adjacent to both of the two parallel conduits having the horizontal constraints. In other words, a Conduit Exit Vertical Constraint may be viewed as a type of vertical constraint imposed by an adjacent conduit on the current nets. FIG. 7 illustrates a Conduit Exit Vertical Constraint (CEVC) upon nets n1 and n2, wherein conduits A2 and A3 each with a horizontal constraint are linked by conduit A1 having an "X" (i.e., "don't care") constraint.

Figure 9:
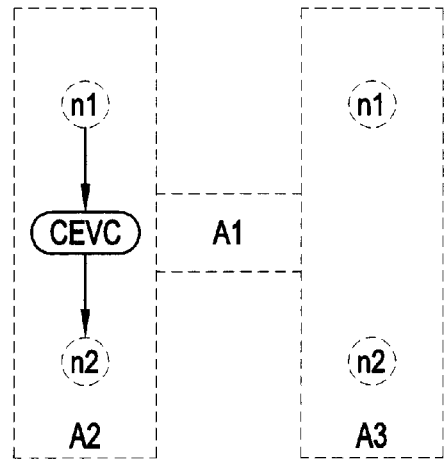
FIG. 9 is a conceptual diagram illustrating a conduit exit vertical constraint loop associated with the circuit block diagram of FIG. 5.

FIG. 9 shows more conceptually the example of a Conduit Exit Vertical Constraint for the conduit A1 shown in FIG. 5.

As shown in FIG. 9, a horizontal constraint imposed upon conduit A2 (due to the overlap of nets n1 and n2) becomes a Conduit Exit Vertical Constraint with respect to conduit A1. In FIG. 5, for the wires exiting conduit A1 and traveling to conduit A2, net n1 is an Up-Single (US) wire type, and net n2 is a Down-Single (DS) wire type. Applying equation 4.1 above, a Conduit Exit Vertical Constraint exists between nets n1 and n2 in conduit A1; more specifically, net n1 is preferably routed physically "above" net n2 when exiting conduit A1 into conduit A2. Notably, a violation of the aforementioned Conduit Exit Vertical Constraint in conduit A1 results in a horizontal constraint between nets n1 and n2 in conduit A2, thereby requiring two tracks for both nets n1, n2 instead of the otherwise single track.

Typically, a Conduit Exit Vertical Constraint is "weaker" than a vertical constraint. In other words, a Conduit Exit Vertical Constraint can be overwritten, or superceded, by a vertical constraint.

As previously mentioned, a second type of constraint usefully defined is an Inter-region Vertical Constraint (IEVC). The nature of an Inter-Region Vertical Constraint can be described according to the following relationship:

$$VC \rightarrow VC \qquad \text{(eq. 4.3)}$$

wherein "VC" denotes a vertical constraint, and, as before, the notation "A→B" means that a constraint "A" in a conduit can potentially "propagate" to an adjacent conduit which has a constraint "B". Thus, the notation "VC→VC" denotes a type of inter-region constraint wherein a vertical constraint in a first conduit can potentially be propagated to a conduit also having a vertical constraint.

Inter-region Vertical Constraints may further be broken down into two categories: (1) Change-layer Inter-region Vertical Constraints (Type A IEVCs), and (2) Same-layer Inter-region Vertical Constraints (Type B IEVCs). Change-layer Inter-region Vertical Constraints (Type A IEVCs) describe adjacent perpendicular conduits linked by wires both making turns and changing layers when traveling between the adjacent perpendicular conduits, in connection with a vertical constraint that could potentially be propagated to an adjacent conduit which also has a vertical constraint. In FIG. 7, nets n1 and n2 turn and cross in the junction area 620 between conduits A1 and A2 (requiring a layer change due to the wire crossing); thus, since both of conduits A1 and A2 have vertical constraints, a Type A (Change-layer) Inter-Region Vertical Constraint is defined relating conduits A1 and A2. It may be noted that, because the two nets n1, n2 can swap order at the "vias" in the junction area 620 between conduits A1 and A2, the vertical constraint in conduit A1 and the vertical constraint in conduit A2 are separated, and thus neither vertical constraint is propagated and no loop can be formed.

Figure 8A:
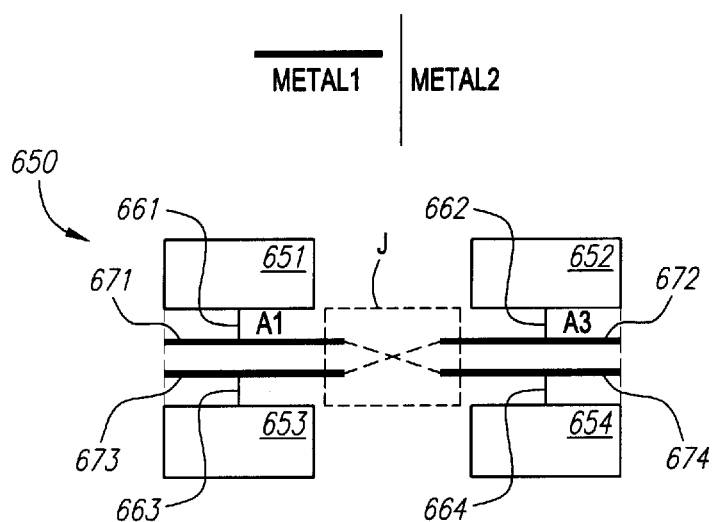
Figure 8B:
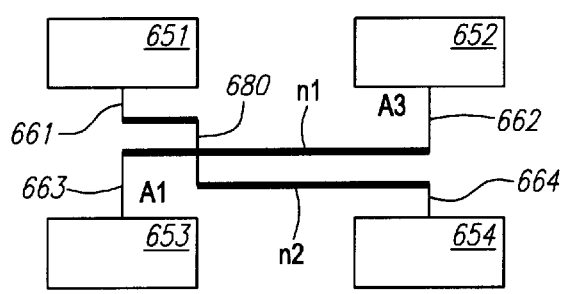

Same-layer Inter-region Vertical Constraints (i.e., Type B IEVCs), as opposed to change-layer Inter-region Vertical Constraints (i.e., Type A IEVCs), describe parallel conduits or adjacent perpendicular conduits linked by a junction with same-layer wire turns. FIGS. 8A and 8B illustrate an example of an Inter-region Vertical Constraint loop. As shown first in FIG. 8A, circuit elements 651, 652, 653 and 654 are connected to two nets by wires 661, 662, 663 and 664, respectively. Conduits A1 and A3 are defined as shown in FIG. 8A. Between the two nets with a twisted order in the conduits A1, A3 is an Inter-region Vertical Constraint loop, similar to a vertical constraint loop within a traditional channel. In fact, if the conduit were to be defined as the union of conduits A1, A3 and junction J (between conduits A1 and A3), the Inter-region Vertical Constraint loop would be entirely within the conduit. The vertical constraint loop has to be broken by a "dogleg" path of one of the two wires. Using the process 400 illustrated in FIG. 4, such a dogleg path can be selectively placed in a less congested conduit than might otherwise be possible. FIG. 8B shows an example of the addition of a dogleg path 680 to net n1, placing it in conduit A1, and thereby breaking the vertical constraint loop.

In a preferred embodiment, information pertaining to the various conduits is stored in a data structure having an entry for each conduit, and intra-region constraints and inter-region constraints are stored in a rule structure for each conduit entry in the data structure. Each rule (i.e., constraint) is preferably associated with a pair of nets, and collectively the rules preferably form a hierarchical rule tree. While each rule could potentially be associated with more than two nets (crosstalk being an example in which one net can have a constraint with respect to two or more nets), it can be advantageous in certain circumstances to break up more complicated rules into pairwise rules. Both the intra-region constraint rule structure and the inter-region constraint rule structure may be similar in form.

Returning once again to the process 400 illustrated in FIG. 4, after the intra-region constraints and inter-region constraints are built in steps 402 and 403, respectively, the process 400 continues with a global wire order negotiation procedure, using inter-region constraint loops to reduce violations of the constraints. Each constraint violation generally results in added routing resources necessary to resolve the violation. The process 400 thus first proceeds to step 407, wherein a determination is made as to whether any constraint loops exist. A constraint loop exists if, for example, a first net (e.g., net1) has a constraint to be in a certain relation (e.g., above) with respect to a second net (e.g., net2), yet the second net (e.g., net2) has another constraint requiring it to be in an opposite relation (e.g., above) with respect to the first net (e.g., net1). If a constraint loop exists, then in step 408, each vertical constraint loop is preferably broken in the region having the least congestion, subject to other potential limitations. Since a constraint loop generally will pass through several regions, the least congested region can be selected based upon, for example, congestion metrics. A constraint loop can be broken up in a variety of ways, such as by swapping track orders in one of the regions where the constraint loop exists. This procedure is amenable to an automated process, whereby the congestion metrics for each region are automatically compared, and the region being the least congested is selected for breaking the constraint loop.

Figure 10A:
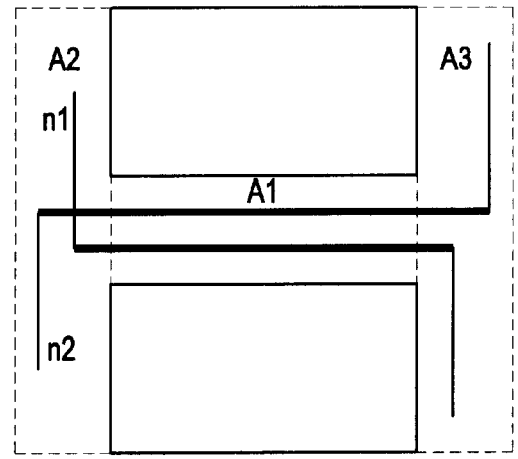
FIGS. 10A and 10B are diagrams illustrating another conduit exit vertical constraint loop.
Figure 10B:
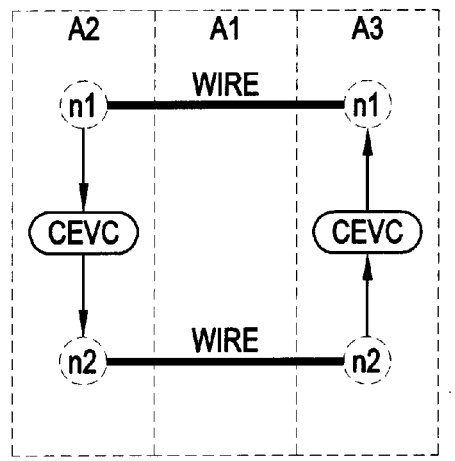

An example of breaking a vertical constraint loop may be explained with reference to FIGS. 10A and 10B. FIG. 10A is a circuit block diagram showing a Conduit Exit Vertical Constraint loop in conduit A1, while FIG. 10B is a more conceptual diagram illustrating the same thing. Unlike a vertical constraint loop in conventional channel routing, which has to be broken in order to make routing feasible, a Conduit Exit Vertical Constraint loop need only be broken when it is desired to save a track.

In a preferred embodiment, a Conduit Exit Vertical Constraint loop is broken by placing the two nets n1, n2 in either conduit A1 or A3 on two tracks, so that the two nets n1, n2 can be placed on the same track in conduit A2. The decision as to which conduit is chosen to break the loop is preferably decided by the costs—i.e., a weighing of various factors relating to size, complexity, etc. A cost value is determined for each Conduit Exit Vertical Constraint, based upon the proposed addition of a new track. Assuming that one of the two nets (e.g., net n1) is assigned to the new track, the cost may be defined, in one embodiment, as:

cost (A, n1, n2)=1, if net n2 can be packed into an existing track;

2, otherwise (i.e., if a second track needs to be added) where "cost (A, n1, n2)" stands for the cost of utilizing conduit A to relieve the constraint with respect to nets n1 and n2. A more refined cost value may take account of the impact on chip size. Thus, if net n2 cannot be packed into an existing track, the cost is nevertheless defined as 1 unless the addition of a second track locally in conduit A causes the chip dimension to increase (i.e., if conduit A is the conduit with the maximum density along a parallel line cut), in which case the cost is 2. Other cost algorithms may also be utilized, including further examples described below. In general, a cost algorithm preferably reflects the impact on the conduit being analyzed, in terms of consumption of resources (e.g., tracks), and may take into account other factors as well.

In one aspect, the above-described methodology of selectively breaking a Conduit Exit Vertical Constraint loop involves a negotiation process, by examining the cost value of breaking the Conduit Exit Vertical Constraint loop in different conduits for each net pair. In effect, the wire order propagations switch between conduits back and forth for different net pairs. This is a fundamental distinction from, for example, one-pass channel ordering method used for routing.

Figure 11A:
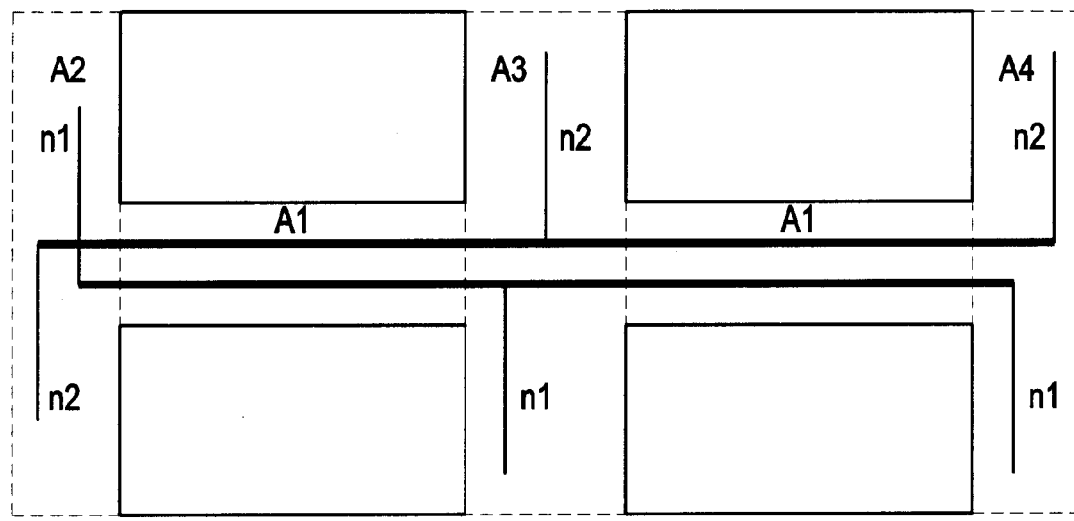
FIGS. 11A and 11B are diagrams illustrating a conduit exit vertical constraint chain having multiple loops.
Figure 11B:
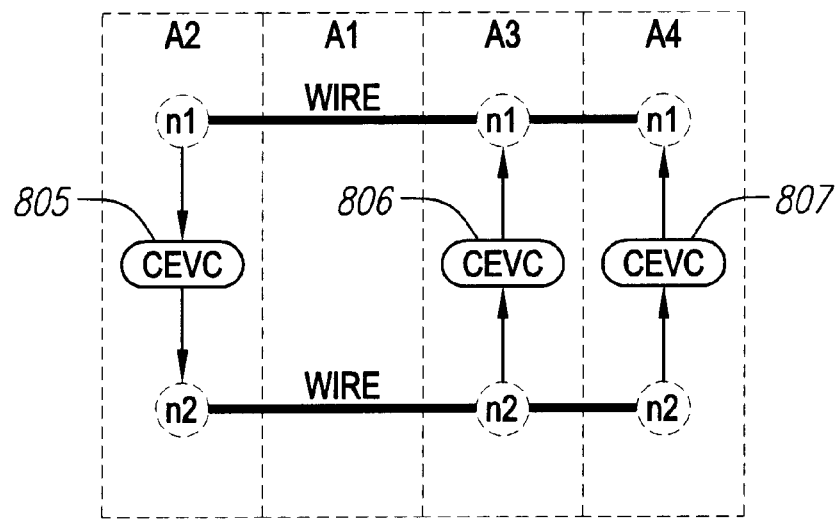

It may occur that a single conduit has more than two Conduit Exit Vertical Constraints with other conduits. In other words, a Conduit Exit Vertical Constraint chain can have more than two loops. FIGS. 11A and 11B illustrate such a case. FIG. 11A is a circuit block diagram, whereas FIG. 11B is more of a conceptual diagram. In FIGS. 11A and 11B, net n1 is oriented upwards in conduit A2 and downwards in conduits A3 and A4, whereas net n2 is oriented downwards in conduit A2 and upwards in conduits A3 and A4. Neither net n1 nor net n2 is constrained in conduit A1. FIG. 11B shows conceptually that, due to Conduit Exit Vertical Constraints, net n1 should be ordered above net n2 in conduit A2, but should be ordered below net n2 in conduits A3 and A4, while the ordering in conduit A1 is not constrained. To decide where to break the Conduit Exit Vertical Constraint loop, the cost equation described earlier herein may be used. A, cost value may thereby be determined for each Conduit Exit Vertical Constraint, based upon the proposed addition of a new track. Thus, in the example of FIGS. 11A–11B, the first Conduit Exit Vertical Constraint 805 has a cost of 1 because, if one new track were added and net n1 assigned to it, then net n2 could remain in the existing track. Likewise, with both of the other Conduit Exit Vertical Constraints 806 and 807 have a cost of 1 because, if one new track were added and net n1 assigned to it, then net n2 could remain in an existing track. In the example of FIGS. 11A–11B, each of the three Conduit Exit Vertical Constraints 805, 806 and 807 therefore have the same cost, and the loop can be broken in any of conduits A2, A3 or A4 with roughly the same impact on the routing cost, at least within the localized chip area. However, if any of conduits A2, A3 or A4 had another net that was already routed in the existing track, then the cost in that conduit A2, A3 or A4 would increase to 2 since the existing track would be unavailable for net n2.

The example in FIGS. 11A–11B is a rather simple one as it only involves two nets with a single track in each conduit; however, a basic principle is that the cost of adding a new track should be relative to the congestion of each conduit. For example, an alternative cost equation taking account of the relative congestion is as follows:

$$\text{cost } (A, n1, n2) = 1 + 1/(n+k)$$

where "cost (A, n1, n2)" is the cost of utilizing conduit A to handle a constraint with respect to nets n1 and n2; n represents the number of free tracks in conduit A; and k represents a fully congested cost factor. For example, assuming for the moment that k=1, if conduit A1 has 3 free tracks, the cost of utilizing conduit A1 to handle a constraint would be 1+1/(3+1)=1.25, whereas if conduit A2 has 9 free tracks, the cost of utilizing conduit A2 to handle the constraint would be 1+1/(9+1)=1.1. Therefore the cost of utilizing conduit A2, which has more free tracks than conduit A, would be less. If conduit 3 had no free tracks, its cost would be 1+1/(0+1)=1.5, the maximum possible cost. If k were chosen as a higher value (e.g., 0.1 or 0.01), then the maximum possible cost would increase much higher relative to the other possible cost values. Such a scheme may be desirable where a selection of conduits is accomplished by a weighing of additional factors other than merely the cost factor.

The aforementioned cost-based methodologies may advantageously be utilized to handle constraints with respect to multiple-pin nets, such as, for example, a long clock net with multiple connections directed upwards and downwards in junctions.

A similar process may be used to handle Inter-region Vertical Constraint loops, regardless of whether they are parallel (aligned) conduit Inter-region Vertical Constraint loops or same-layer turn Inter-region Vertical Constraint loops. The same cost equation as used with Conduit Exit Vertical Constraint loops may be used with respect to Inter-region Vertical Constraint loops. An Inter-region Vertical Constraint loop can be broken in the conduits or in the junction between the two conduits, by adding dogleg paths in either of the two conduits or in the junction.

Yet another type of loop that may occur is a loop between a junction where a Conduit Exit Vertical Constraint exists, and a conduit having an intra-region vertical constraint. This type of loop may be broken either by adding one track for the Conduit Exit Vertical Constraint or by adding a dogleg for the Inter-region Vertical Constraint. A similar cost equation as described above may be used to determine where to break the loop.

Returning again to FIG. 4, once the vertical constraint loop(s) are broken, or if no vertical constraint loops exist, the process 400 moves to step 410, wherein detail routing in the conduits is performed based upon the track ordering arrived at after the global wire order negotiation procedure. Such detail routing can be accomplished according in any conventional manner, since the track ordering has been determined at this point. The routing can be done in either on-grid or gridless style. Next, in step 412, a determination is made as to whether the track ordering can be satisfied, based upon the results of detail routing in step 410. If not, then, in step 415, the constraint graphs are updated, and the process 400 returns to step 407, wherein the constraints are processed through an order negotiation technique as described previously.

If, on the other hand, the track ordering can be satisfied, then, as indicated by step 420, the wires are embedded, starting from the most congested conduit. The process of embedded the wires may be carried out according to any conventional technique, and involves finding specific locations of the wires. Locations for wires may be determined by checking whether or not the proposed location has enough space, based on the defined wire ordering, and using an LEA-based algorithm (such as a modified gridded or gridless version of a conventional channel routing tool). The wire embedded procedure continues until all wires or embedded; or else all space is exhausted. Also as part of step 420, if any wires cannot be embedded, then the unrouted wires are finished using a supplementary tool, such as a maze router. Experiment has shown that 95% or more of routing can be accomplished using the process 400 of FIG. 4 without the need for a maze router to finish any unrouted wires or nets.

The routing process 400 is applicable to N-layer routing. In one embodiment, N-layer routing is modeled using the inter-region constraints described herein by allowing wires on only those chip layers which might cause physical violations on a chip. Generally, in the absence of vias, only adjacent chip layers can have violations, whereas non-adjacent layers generally cannot have violations. As a specific example, in a preferred-layer HVHV (i.e., horizontal/vertical/horizontal/vertical) chip model, assuming that layer 1 and layer 4 have no vias defined between them, it would not be possible for a metal on layer 1 to have a shorting violation against a metal on layer 4; thus, no constraints between layer 1 and layer 4 would be considered. It should be noted, however, that the N-layer routing methodology is not limited to the preferred-layer HVHV chip model.

During routing, multiple conduits can be routed together under certain circumstances. Adjacent or nearby conduits, including junction areas, which are aligned and of the same size can be merged and, hence, routed together. The simplest case if a merged rectangular or rectilinear conduit. In the case of a merged conduit, the conduit density is determined by the maximum density at all columns among the conduits and junctions in the merged conduit. With a merged conduit, there are three types or classes of constraints of interest: intra-region constraints (such as vertical constraints and horizontal constraints); Conduit Exit Vertical Constraints; and same-layer Inter-region Vertical Constraint loops. If any of these inter-region constraints exist with respect to the merged conduit, then the globally optimum solution is not guaranteed according to the process 400 of FIG. 4.

An advantage that may arise in implementations of various embodiments disclosed herein is that conduit ordering becomes less important than with traditional detail routers. Another advantage that may arise is that conduit definition can be more "loose." For example, a routing region or conduit having only one side with fixed pins can be processed, because inter-region constraints are modeled. With past techniques, the channel ordering is propagated in a one-way fashion; thus, if the initial ordering were poor, there would be no way of turning back and readjusting the prior orderings. Other advantages that may be experienced are reduced chip size due to less wasted space and wire cross-overs, and increased speed over certain conventional detail routers, such as maze routers.

Crosstalk estimation and reduction is preferably handled after global routing is carried out, that is, after the routing process 400 depicted in FIG. 4 is completed. During crosstalk processing, global information of all regions and all nets is considered through the use of the inter-region constraint graph that was built during global routing. Conventional crosstalk estimation techniques are described, for example, in T. Xue et al, "Post Global Routing Crosstalk Risk Estimation and Reduction," *DAC Proceeedings* (1996), pp. 302–309, hereby incorporated by reference as if set forth fully herein. The concept of accumulated-noise crosstalk is described therein, which is defined as the sum of all noise between a victim net and all aggressors in all regions. The amount of crosstalk can be reduced by inserting shields or widening spacing between nets at risk. While conventional crosstalk estimation can be suitable in many circumstances, the techniques for crosstalk reduction based on global routing is weak because conventional global routers cannot provide the detailed track location in order to calculate the exact noise. The inter-region constraint graph built during global routing in accordance with the process 400 shown in FIG. 4 may be advantageously used to provide more detailed track location information so as to arrive at more accurate crosstalk estimations and, if necessary, reduction measures.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. In an electronic design automation system, a method for placement and routing, comprising the steps of:
   receiving a netlist file comprising a specification of logic cell instances and nets connecting said logic cell instances;
   placing said logic cell instances in a circuit layout by giving said logic cell instances specific coordinate locations in said circuit layout, said step of placing said logic cell instances comprising the step of defining a plurality of conduits separating said logic cell instances;
   locating said nets in said conduits;
   identifying a set of constraints associated with the nets placed in said conduits; and
   for each conduit, associating the nets placed therein with one or more tracks in the conduit using constraint information for both the conduit being processed and other nearby conduits, regardless of whether said other nearby conduits were previously processed or are as yet unprocessed.

2. The method of claim 1, wherein said step of identifying said set of constraints associated with the nets placed in said conduits comprises the step of identifying one or more conduit exit vertical constraints.

3. The method of claim 1, wherein said step of identifying said set of constraints associated with the nets placed in said conduits comprises the step of identifying one or more inter-regional vertical constraints.

4. The method of claim 1, wherein said step of identifying said set of constraints associated with the nets placed in said conduits comprises the step of identifying both intra-region and inter-region constraints associated with the nets placed in said conduits.

5. The method of claim 4, wherein said intra-region constraints comprise at least vertical constraints and horizontal constraints.

6. The method of claim 5, further comprising the step of generating a constraint graph for said intra-region constraints and for said inter-region constraints.

7. The method of claim 4, wherein said step of, for each conduit, associating the nets placed therein with one or more tracks in the conduit using constraint information for both the conduit being processed and other nearby conduits, comprises the step of, for each conduit, associating the nets placed therein with one or more tracks in the conduit based upon both said intra-region constraints and said inter-region constraints relating to the conduit and said other nearby conduits.

8. The method of claim 1, wherein said step of, for each conduit, associating the nets placed therein with one or more tracks in the conduit using constraint information for both the conduit being processed and other nearby conduits, comprises the steps of identifying a cost value for breaking a constraint for each conduit affected by said constraint, and selecting the conduit with the lowest cost value for breaking said constraint.

9. The method of claim 8, wherein said cost value for a conduit is inversely proportional to a number of free tracks in the conduit.

10. A computer readable medium having stored therein one or more sequences of instructions for performing placement and routing functions in an electronic design automation system, said one or more sequences of instructions causing one or more processors to perform a plurality of acts, said acts comprising:

receiving a netlist file comprising a specification of logic cell instances and nets connecting said logic cell instances;

placing said logic cell instances in a circuit layout by giving said logic cell instances specific coordinate locations in said circuit layout, said act of placing said logic cell instances comprising the act of defining a plurality of conduits separating said logic cell instances;

locating said nets in said conduits;

identifying a set of constraints associated with the nets placed in said conduits; and for each conduit, associating the nets placed therein with one or more tracks in the conduit using constraint information for both the conduit being processed and other nearby conduits, regardless of whether said other nearby conduits were previously processed or are as yet unprocessed.

11. The computer readable medium of claim 10, wherein said act of identifying said set of constraints associated with the nets placed in said conduits comprises the act of identifying one or more conduit exit vertical constraints.

12. The computer readable medium of claim 10, wherein said act of identifying said set of constraints associated with the nets placed in said conduits comprises the act of identifying one or more inter-regional vertical constraints.

13. The computer readable medium of claim 10, wherein said act of identifying said set of constraints associated with the nets placed in said conduits comprises the act of identifying both intra-region and inter-region constraints associated with the nets placed in said conduits.

14. The computer readable medium of claim 13, wherein said intra-region constraints comprise at least vertical constraints and horizontal constraints.

15. The computer readable medium of claim 14, wherein said acts further comprise generating a constraint graph for said intra-region constraints and for said inter-region constraints.

16. The computer readable medium of claim 4, wherein said act of, for each conduit, associating the nets placed therein with one or more tracks in the conduit using constraint information for both the conduit being processed and other nearby conduits, comprises the act of, for each conduit, associating the nets placed therein with one or more tracks in the conduit based upon both said intra-region constraints and said inter-region constraints relating to the conduit and said other nearby conduits.

17. The computer readable medium of claim 10, wherein said act of, for each conduit, associating the nets placed therein with one or more tracks in the conduit using constraint information for both the conduit being processed and other nearby conduits, comprises the acts of identifying a cost value for breaking a constraint for each conduit affected by said constraint, and selecting the conduit with the lowest cost value for breaking said constraint.

18. The computer readable medium of claim 17, wherein said cost value for a conduit is inversely proportional to a number of free tracks in the conduit.

19. In an electronic design automation system wherein a netlist file is received for placing and routing, said netlist file comprising a specification of logic cell instances and nets connecting said logic cell instances, said logic cell instances being placed in a circuit layout such that a plurality of conduits between said logic cell instances are defined, a method for routing, comprising the steps of:

locating said nets in said conduits;

identifying a set of constraints associated with the nets placed in said conduits; and for each conduit, associating the nets placed therein with one or more tracks in the conduit using constraint information for both the conduit being processed and other nearby conduits, regardless of whether said other nearby conduits were previously processed or are as yet unprocessed.

20. The method of claim 19, wherein said step of identifying said set of constraints associated with the nets placed in said conduits comprises the step of identifying one or more conduit exit vertical constraints.

21. The method of claim 19, wherein said step of identifying said set of constraints associated with the nets placed in said conduits comprises the step of identifying one or more inter-regional vertical constraints.

22. The method of claim 1, wherein said step of identifying said set of constraints associated with the nets placed in said conduits comprises the step of identifying both intra-region and inter-region constraints associated with the nets placed in said conduits.

23. The method of claim 22, wherein said step of, for each conduit, associating the nets placed therein with one or more tracks in the conduit using constraint information for both the conduit being processed and other nearby conduits, comprises the step of, for each conduit, associating the nets placed therein with one or more tracks in the conduit based upon both said intra-region constraints and said inter-region constraints relating to the conduit and said other nearby conduits.

* * * * *